US012140698B2

(12) United States Patent
Akanuma et al.

(10) Patent No.: US 12,140,698 B2
(45) Date of Patent: Nov. 12, 2024

(54) LIGHT DEFLECTOR, DEFLECTING DEVICE, DISTANCE MEASUREMENT DEVICE, IMAGE PROJECTION DEVICE, AND VEHICLE

(71) Applicant: Ricoh Company, Ltd., Tokyo (JP)

(72) Inventors: Goichi Akanuma, Kanagawa (JP); Shinichi Kojima, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 1033 days.

(21) Appl. No.: 17/070,071

(22) Filed: Oct. 14, 2020

(65) Prior Publication Data

US 2021/0156964 A1    May 27, 2021

(30) Foreign Application Priority Data

Nov. 27, 2019  (JP) ................. 2019-214513

(51) Int. Cl.
*G01S 7/481* (2006.01)
*B81B 3/00* (2006.01)
(Continued)

(52) U.S. Cl.
CPC .......... *G01S 7/4811* (2013.01); *B81B 3/0045* (2013.01); *G01S 17/08* (2013.01); *G01S 17/931* (2020.01); *G02B 26/0858* (2013.01); *G02B 26/10* (2013.01); *G02B 27/0101* (2013.01); *B81B 2201/042* (2013.01)

(58) Field of Classification Search
CPC ........................ G02B 26/105; G02B 26/0858
See application file for complete search history.

(56) References Cited

U.S. PATENT DOCUMENTS 6,177,667 B1    1/2001 Fujita et al.
2010/0033685 A1    2/2010 Seo et al.
(Continued)

FOREIGN PATENT DOCUMENTS

JP    2011-018026    1/2011
JP    2011-095331    5/2011
(Continued)

OTHER PUBLICATIONS

Machine Translation of JP2012063413A (Year: 2012).*

*Primary Examiner* — Yuqing Xiao
*Assistant Examiner* — Zhengqing Qi
(74) *Attorney, Agent, or Firm* — XSENSUS LLP

(57) ABSTRACT

A light deflector includes a mirror unit having a reflecting surface; a pair of supports supporting the mirror unit; a pair of drive beams; a frame supporting the pair of drive beams in a cantilevered state; and connecting parts connecting the pair of drive beams to the pair of supports, respectively. Each of the connecting parts has a first area between the first axis and a corresponding drive beam of the pair of drive beams, and a second area at an opposite side of the first area relative to the first axis. The second area includes a projection projecting in a first direction opposite to a second direction toward a portion at which the corresponding drive beam is supported by the frame. The projection includes a first fillet of a fillet shape at an end proximate to a corresponding support of the pair of supports.

12 Claims, 16 Drawing Sheets

(51) Int. Cl.
*G01S 17/08* (2006.01)
*G01S 17/931* (2020.01)
*G02B 26/08* (2006.01)
*G02B 26/10* (2006.01)
*G02B 27/01* (2006.01)

(56) References Cited

U.S. PATENT DOCUMENTS

| | | | |
|---|---|---|---|
| 2010/0195180 A1 | 8/2010 | Akanuma et al. | |
| 2010/0309536 A1 | 12/2010 | Akanuma et al. | |
| 2012/0120470 A1* | 5/2012 | Kitazawa | B81B 3/0045 |
| | | | 359/221.3 |
| 2015/0062683 A1 | 3/2015 | Akanuma et al. | |
| 2015/0077823 A1 | 3/2015 | Hashiguchi et al. | |
| 2015/0168718 A1* | 6/2015 | Lee | G02B 27/01 |
| | | | 359/631 |
| 2016/0109697 A1 | 4/2016 | Nakagawa et al. | |
| 2018/0139404 A1 | 5/2018 | Murakami | |
| 2019/0004312 A1* | 1/2019 | Jeong | G02B 26/085 |
| 2019/0258049 A1* | 8/2019 | Sakurai | G02B 26/0858 |
| 2019/0391394 A1 | 12/2019 | Shinkawa et al. | |
| 2020/0183151 A1 | 6/2020 | Akeshi et al. | |
| 2020/0393545 A1* | 12/2020 | Shani | G01S 17/894 |

FOREIGN PATENT DOCUMENTS

| | | |
|---|---|---|
| JP | 2012063413 A * | 3/2012 |
| JP | 2014-056020 | 3/2014 |
| JP | 2015-129867 | 7/2015 |
| JP | 2017-016018 | 1/2017 |
| JP | 2019-144416 | 8/2019 |
| WO | WO2010/035759 | 4/2010 |
| WO | WO2014/122781 A1 | 8/2014 |

\* cited by examiner

FIG. 3 COMPARATIVE EXAMPLE

LIGHT DEFLECTOR, DEFLECTING DEVICE, DISTANCE MEASUREMENT DEVICE, IMAGE PROJECTION DEVICE, AND VEHICLE

CROSS-REFERENCE TO RELATED APPLICATIONS

This patent application is based on and claims priority pursuant to 35 U.S.C. 119(a) to Japanese Patent Application No. 2019-214513, filed on Nov. 27, 2019, in the Japan Patent Office, the entire disclosure of which is hereby incorporated by reference herein.

BACKGROUND

Technical Field

Embodiments of the present disclosure relate to a light deflector, a deflecting device, a distance measurement device, and a vehicle.

Related Art

In recent years, with the development of micromachining technology applying semiconductor manufacturing technology, development of micro electro mechanical systems (MEMS) devices manufactured by micromachining silicon or glass is advancing.

As a MEMS device, there is known a light deflector that includes a piezoelectric actuator including an elastic beam and a mirror including a reflecting surface, which are formed as a single integrated unit on a wafer, the piezoelectric actuator also including a thin film of a piezoelectric material superposed co the elastic beam, and that causes the mirror to oscillate using the piezoelectric actuator.

SUMMARY

In one aspect of this disclosure, there is described a light deflector including a mirror unit having a reflecting surface configured to reflect light; a pair of supports with one end of each of the pair of supports coupled to the mirror unit to support live mirror unit, a pair of drive beams each coupled to the other end of a corresponding support of the pair of supports, the pair of drive beams being configured to deform the pair of supports to rotate the mirror unit around a first axis; a frame supporting the pair of drive beams in a cantilevered state; and connecting parts connecting the pair of drive beams to the pair of supports, respectively. Each of the connecting parts has a first area between the first axis and a corresponding drive beam of the pair of drive beams, and a second area at an opposite side of the first area relative to the first axis. The second area includes a projection projecting in a direction opposite to a direction toward a portion at which the corresponding drive beam is supported by the frame. The projection includes a first fillet of a fillet shape at an end proximate to a corresponding support of the pair of supports.

In another aspect of this disclosure, there is disclosed deflecting device including the light deflector and a light source.

In even another aspect of this disclosure, there is disclosed a distance measurement device including the light deflector.

In still another aspect of this disclosure, vehicle composing the distance measurement device.

Further described is an image projection device comprising the light deflector.

Still further described is a vehicle including the image projection device.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
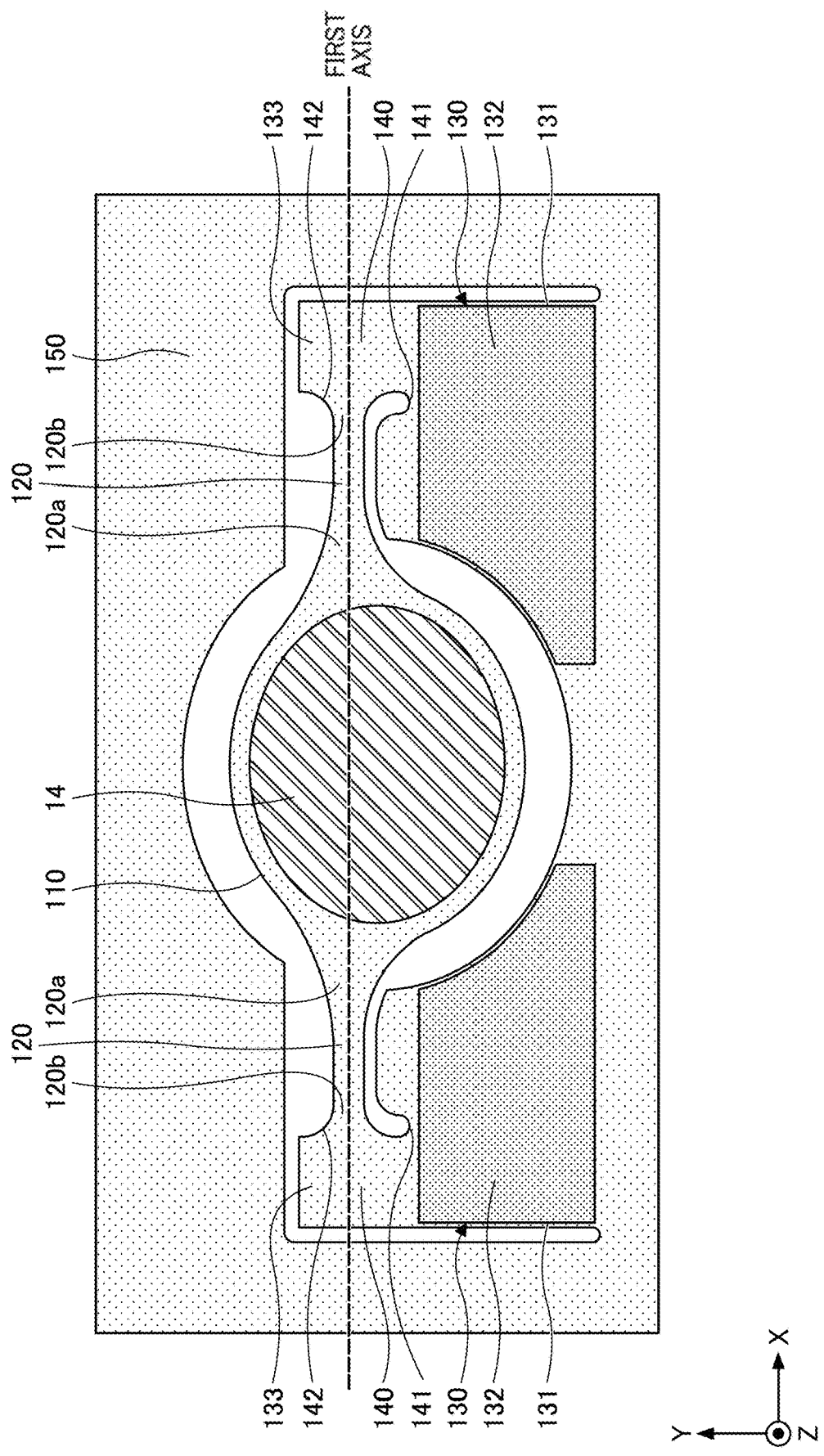
FIG. 1 is a top view of a light deflector according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

The embodiments of the present disclosure provide a light deflector with a higher deflection angle at which the light deflector reaches a breaking point so as to obtain a wider angle of view and a higher resolution.

Embodiments of the present invention are described in detail referring to the drawings. Like reference signs are applied to identical or corresponding components throughout the drawings and redundant description thereof may be omitted.

In recent years, light deflectors used in image forming apparatuses are to have a higher resolution and a greater amplitude of a mirror unit to obtain higher quality images.

The speed of rotation of a mirror unit of the light deflector increases in proportion to the amplitude of the mirror unit, that is, the rotational acceleration of the mirror unit increases as the amplitude of the mirror unit increases. Further, as the amplitude of the light deflector increases, the stress applied to a stationary part and a torsion bar supporting a mirror unit increases. In addition to the increase in the stress on the torsion bar and the stationary part, the angle of deflection of the mirror unit reaches a breaking limit to cause damage to the torsion bar and the stationary parts, thus resulting in the breakdown of the light deflector.

As a higher resolution involves more scanning lines, the drive frequency (i.e., the resonance frequency) is to be increased. As the resonance frequency increases, the rotational acceleration of the mirror unit increases in proportion to the square of the resonance frequency. With an increase in the frequency, the load on the stationary part and torsion bar supporting the mirror unit increases abruptly even when the amplitude of the mirror unit remains unchanged. When the road on the stationary part and the torsion bar exceeds the breaking strength of the torsion bar and the stationary part, the light deflector might be damaged.

In the typical light deflectors with a cantilever structure, one edge of a connecting part between a torsion bar and a drive beam (i.e., a beam) supporting the torsion bar in a cantilevered slate is open, which might cause the connecting part to be deformed more significantly. With such a deformation of the connecting part, the twist of the torsion bar is more likely to cause an overload on the light deflector, resulting in a failure of the light deflector.

To avoid such a situation, a light deflector according to an embodiment of the present disclosure has a fillet shape formed at a free-end portion of the drive beam (i.e., the beam), that is, at the edge of the connecting part between the torsion bar and the drive beam. This configuration distributes the stress to both the free-end portion and the fixed-end portion of the drive beam so as to reduce the stress applied to the connecting part. As a result, the maximum stress applied to the light deflector is advantageously reduced, and a deflection angle at which the light deflector reaches a breaking point is increased. Thus, the degree of the amplitude of the mirror can be increased.

Further, a fillet shape is also formed at an opposite side of the beam. This configuration also distributes the load due to the amplitude (i.e., deflection) of the mirror, which further reduces the maximum stress applied to the light deflector. Thus, an increased deflection angle limit of the light deflector to reach the breaking point is obtained even when the resonance frequency of the mirror is increased.

Figure 2:
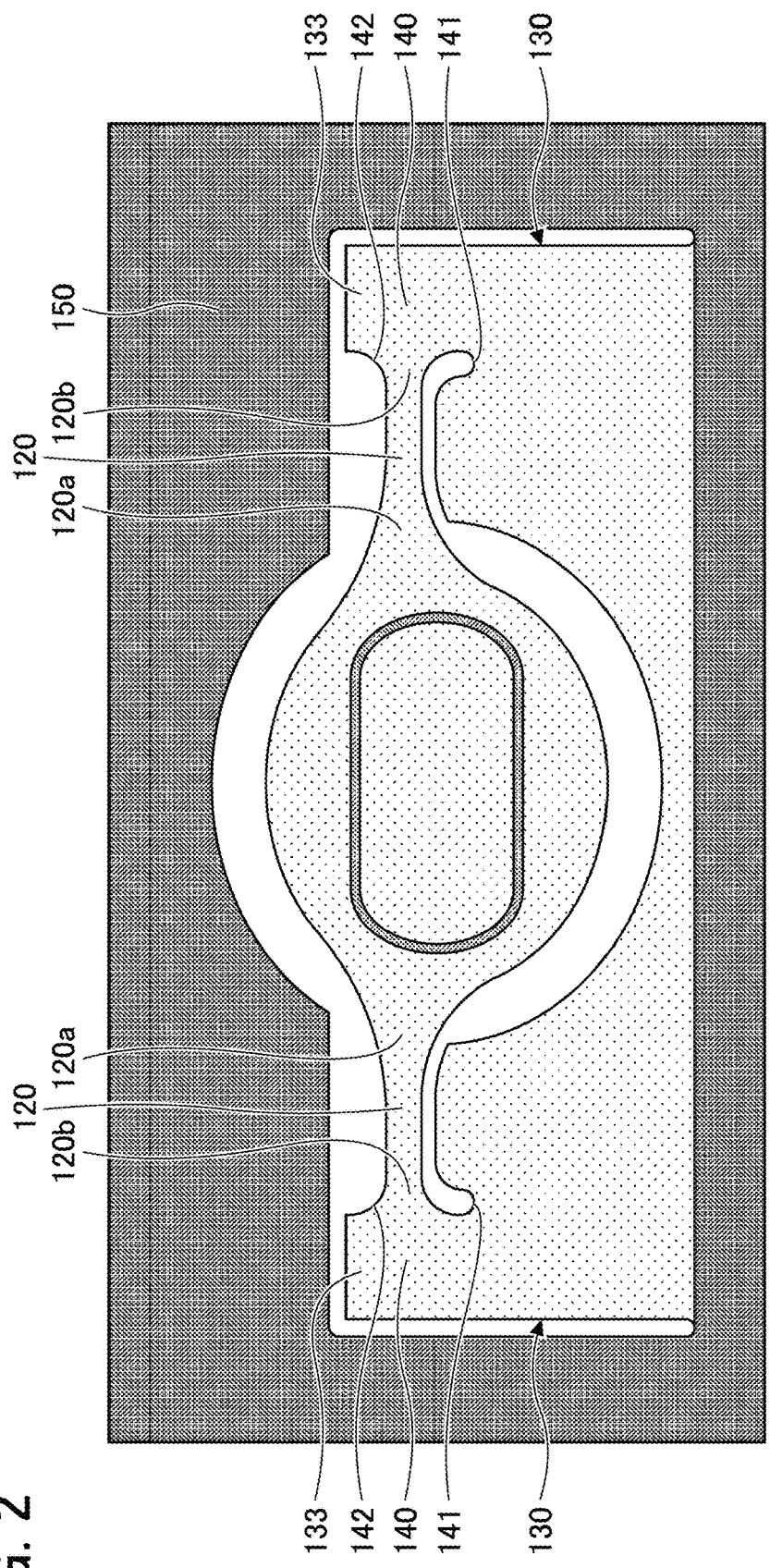
FIG. 2 is a rear view of the light deflector in FIG. 1.

A light deflector according to a first embodiment of the present disclosure is described with reference to FIGS. 1 and 2. FIG. 1 is a top view of the light deflector according to the present embodiment, and FIG. 2 is a rear view of the light deflector in FIG. 1.

The light deflector according to the present embodiment includes a mirror unit 110 and torsion bars 120 at both sides of the mirror unit 110, respectively. The mirror unit 110 has a reflecting surface 14. The torsion bats 120 are typically referred to as a torsion bar spring. In the present disclosure, it is referred to as a torsion bar 120. In the example of FIG. 1, the light deflector includes two torsion bars 120. This is only one example. In some embodiments, the light deflector may include two or mote torsion bars 120.

One end 120a of each torsion bar 120 is coupled to the mirror unit 110, and the other end 120b of each torsion bar 120 is coupled to a corresponding drive beam 130 through a connecting part 140. The drive beams 130 are disposed along the axial direction (i.e., the X-axis direction) of the torsion bars 120 to cause the mirror unit 110 to become warped.

The drive beam 130 includes a beam 131 and a piezoelectric material 132 stacked on the beam 131, and is a rectangular flat plate of a unimorph structure. The beam 131 is a base, such as a silicon substrate. One end of the drive beam 130 is coupled to a stationary-frame 150, and the other end of the drive beam 130 is coupled to the other end 120b of each torsion bar 120 through a corresponding connecting part 140. In the present disclosure, the stationary frame 150 is sometimes referred to also as a frame.

In such a configuration of the light deflector, the mirror unit 110 and the pair of torsion bars 120 are supported by the drive beam 130 at one side of the light deflector relative to the first axis serving as the rotation axis of the mirror unit 110 (i.e., the central axis of the pair of torsion bars 120). In other words, the light deflector according to the first embodiment has a cantilever structure. Specifically, the mirror unit 110 and the torsion bars 120 are supported by the drive beam 130 on the Y side relative to the first axis. In the light deflector according to the present embodiment, the drive beam 130 is supported by the stationary frame 150 in a cantilevered state.

Further, in the light deflector according to the present embodiment, a fixed-end fillet 141 and a free-end fillet 142 are provided at a portion connecting between the drive beam 130 and a corresponding torsion bar 120 so as to reduce the stress concentrated on that connecting portion and thus prevent the breakage of the light deflector. Specifically, the fixed-end fillet 141 is disposed at a drive beam 130 side relative to the first axis. The free-end fillet 142 is provided at a projection 133 that forms an end of the connecting portion projecting in the +Y direction relative to the first axis. As illustrated in FIG. 1, the free-end fillet 142 is disposed at the +Y side of the projection 133 and the torsion bar 120.

In a light deflector according to a comparative example, the connecting part 140 between the torsion bar 120 and the drive beam 130 has a fillet shape only at a portion proximate to the drive beam 130. In other words, only the fillet shape that corresponds to the fixed-end fillet 141 is formed at the connecting part 140 according to the comparative example. By contrast, in the light deflector according to the present embodiment, the connecting part 140 between the torsion bar 120 and the drive beam 130 has a fillet shape at a portion proximate to the projection 133 proofing from the beam 131 of the drive beam 130 in the +Y direction relative to the first axis, as well as the fillet shape at the portion proximate to the drive beam 130. In other words, a fillet shape is formed at each side of the first axis serving as the central axis of twist of the torsion bars 120 and supporting the torsion bars 120.

In the present embodiment, the portion connecting between the drive beam 130 and the torsion bar 120 is the connecting part 143. Further, the connecting part 140, which is caused to oscillate by the oscillation of the drive beam 130, may be a part of the drive beam 130. In other words, as illustrated in FIG. 1, the connecting part 140 is a portion connecting between the other end 120*b* of the torsion bar 120 and the drive beam 130. As this connecting portion is also caused to oscillate together with the oscillation of the drive beam 130, the connecting portion may be included in the drive beam 130.

In the present disclosure, the connecting part 140 has a first area and a second area. The first area is at a drive beam 130 side relative to the first axis, and the second area is at a projection 133 side relative to the first axis. Further, the free-end fillet 142 is referred to as a first fillet, and the fixed-end fillet 141 is referred to as a second fillet.

The light deflector according to the present embodiment is manufactured by a similar process to micro-electromechanical systems (MEMS). Specifically, a silicon on insulator (SOI) substrate is processed to form the mirror unit 110, the torsion bar 120, and the beam 131 of the drive beam 130 as a single integrated unit. The mirror unit 110 has a reflecting surface 14 that is a thin film made of metal, such as aluminum or silver, formed on the surface of the silicon layer.

The drive beam 130 supports the torsion bars 120 and the mirror unit 110 in a cantilevered state. The connecting part 140 at the end of the drive beam 130 has a free end and is free from undesired constraints when the mirror unit 110 rotates. This enables the mirror unit 110 to rotate at a significant deflection angle. With this configuration, a rotational power generated by the bending of the drive beam 130 is effectively transmitted to cause the torsion bars 120 to be deformed in a twisting direction.

The light deflector with a cantilever structure is designed to have a bending resonance induced by the drive beam 130 and a twist resonance induced by the torsion bars 120, which are appropriately designed to increase the operation sensitivity, that is, a deflection angle with respect to a voltage applied to the light deflector.

In the light deflector with a cantilever structure, a deflection angle of the light deflector is subject to constraints of a deflection angle at which the light deflector reaches the breaking point. Such a deflection angle of the light deflector to reach the breaking point is determined by the strength of a silicon layer constituting the mirror unit 110, the torsion bars 120, and the beam 131 of the drive beam 130. As the strength limit or the fracture stress is determined by the material (i.e., silicon), the light deflector is to be designed to have a lower stress generated by the rotation of the mirror unit 110 than the fracture stress.

In the light deflector according to the present embodiment, the connecting part 140 between the torsion bar 120 and the drive beam 130 has a fillet shape at each side of the first axis of the torsion bars 120, that is, the central axis of twist of the torsion bars 120. In this configuration, each torsion bar 120 is supported by the portions of a corresponding connecting part 140 at which the fillet shapes are formed at the both sides of the first axis. In other words, a fillet shape is formed at the projection 133 side relative to the first axis, that is, at the +Y side relative to the first axis as well as at the −Y side relative to the first axis. This configuration reduces the stress applied to the connecting part 140 between the torsion bar 120 and the drive beam 130 when the torsion bars 120 rotate, and achieves an increase in a deflection angle at which the light deflector reaches a breaking point.

Figure 3:
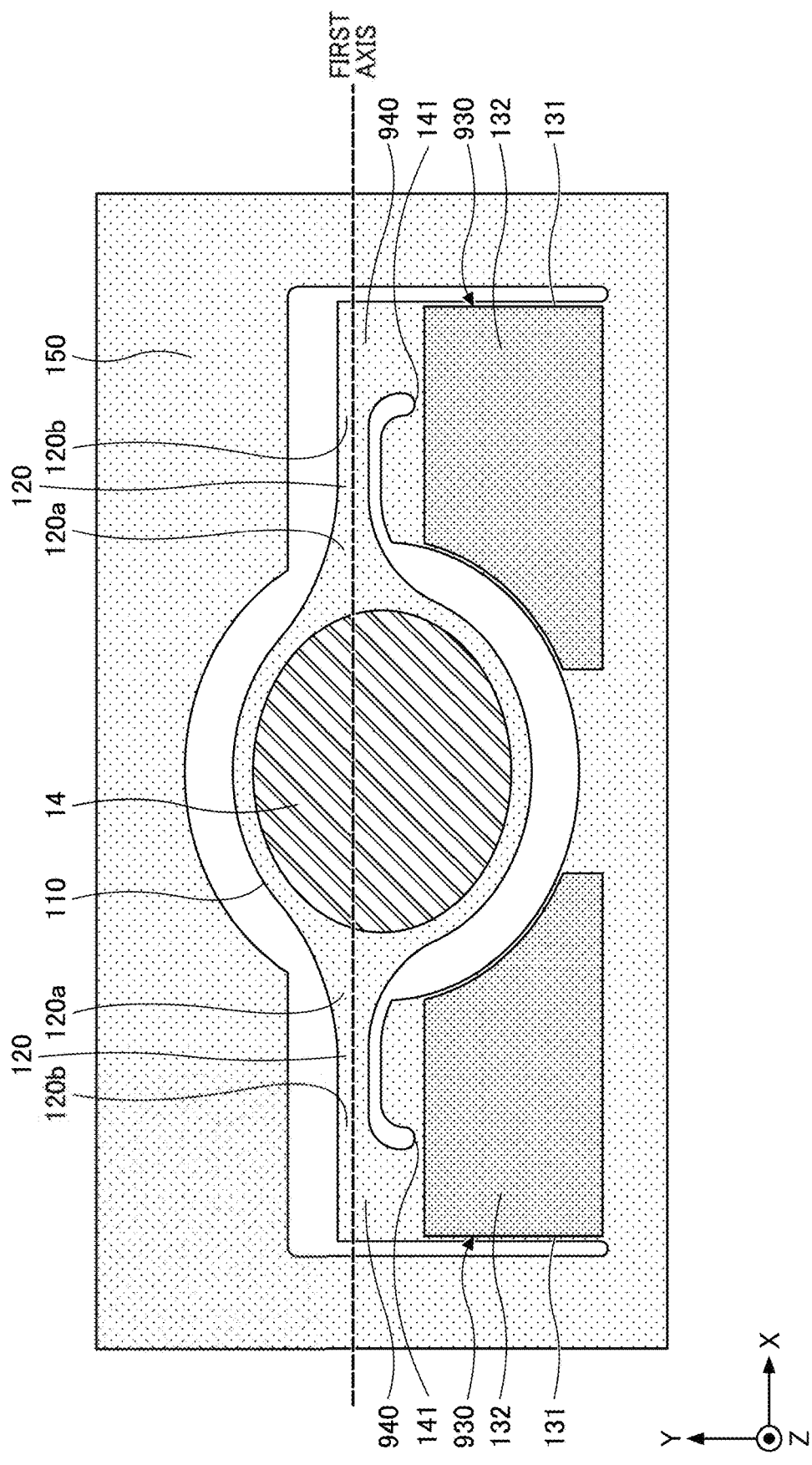
FIG. 3 is a top view of a light deflector provided with a fillet only at a fixed end of a connecting part, according to a comparative example.

In a comparative example as illustrated in FIG. 3, a connecting part 940 between a torsion bar 120 and a drive beam 930 is without a free-end fillet. In such a light deflector, a significant load and stress is applied to a fixed-end fillet 141 at the connecting part 940. As a result, the connecting part 940 between the torsion bar 120 and the drive beam 930 is susceptible to damage.

In the light deflector according to the present embodiment, the fixed-end fillet 141 and the free-end fillet 142 have different curvatures. Specifically, the free-end fillet 142 has a smaller curvature than the fixed-end fillet 141. In the present embodiment, the free-end fillet 142 may have an arc shape.

If the fixed-end fillet 141 and the free-end fillet 142 have an arc shape with the same curvature, the stress applied to a portion proximate to the fixed-end fillet 141 would be increased. To deal with such an issue, the light deflector according to the present embodiment is designed such that the free-end fillet 142 has a smaller curvature than the fixed-end fillet 141. This equalizes the applied stress between the portion proximate to the fixed-end fillet 141 and the portion proximate to the free-end fillet 142.

Figure 4:
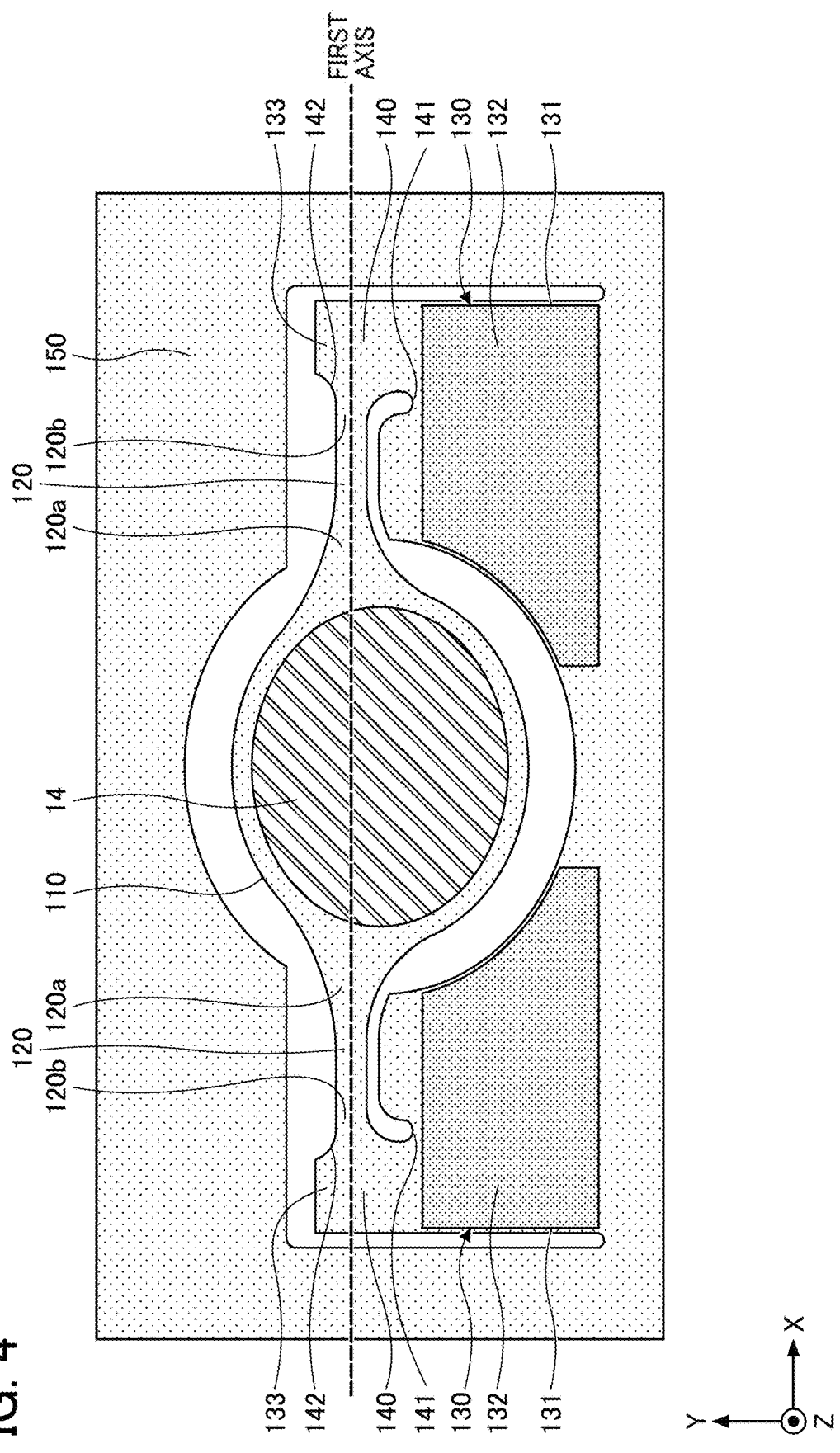
FIG. 4 is a top view of a light deflector according to a second embodiment of the present disclosure.

Next, a light deflector according to a second embodiment is described. In the light deflector according to the second embodiment as illustrated in FIG. 4, a free-end fillet 142 has an elliptic shape. The major axis of the ellipse is parallel to the X-axis direction, that is, the longitudinal direction of the torsion bar 120. With the free-end fillet 142 shaped in such a manner, the connecting part 140 between the torsion bar 120 and the drive beam 130 has a shape in which the width increases to have gradually increasing curvature in a direction from the torsion bar 120 to the drive beam 130. As a result, the stress concentrated on the connecting part is effectively reduced, and a deflection angle at which the light deflector reaches a breaking point is further increased.

The characteristic features other than those described above are the same as those in the first embodiment.

Figure 5:
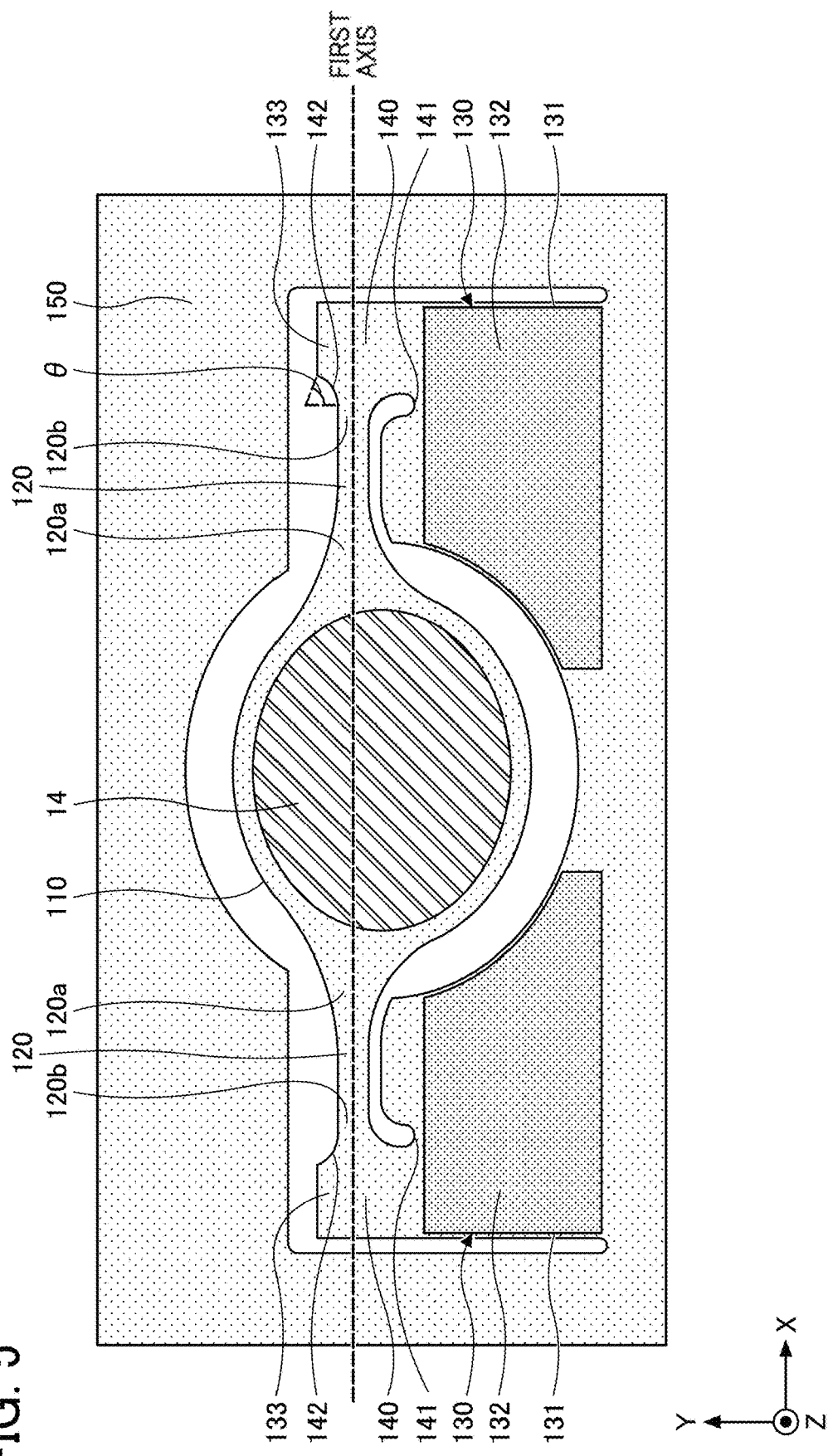
FIG. 5 is a top view of a light deflector according to a third embodiment of the present disclosure.

Next, a light deflector according to a third embodiment is described. In the light deflector according to the third embodiment as illustrated in FIG. 5, a free-end fillet 142 has an arc shape with a predetermined radius of curvature, and a central angle θ of the fillet shape of the free-end fillet 142 is 90 degrees or less.

Such a shape reduces the length of the projection 133 in the +Y direction, which further reduces the weight of the drive beam 130 and thus increases the resonance frequency while preventing a failure of the light deflector due to the bending of the drive beam 130.

The characteristic features other than those described above are the same as those in the first embodiment.

Figure 6:
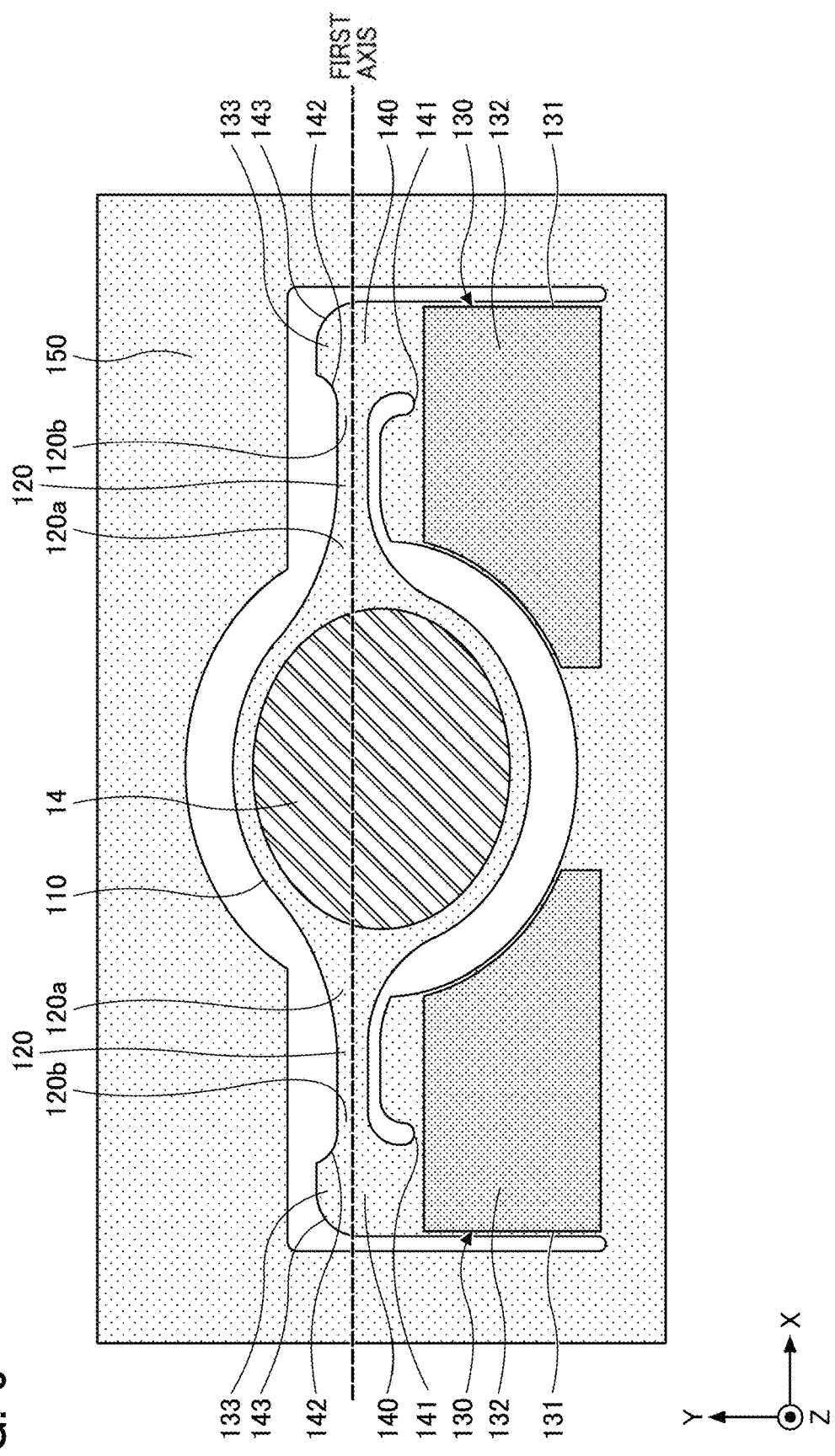
FIG. 6 is a top view of a light deflector according to a fourth embodiment of the present disclosure.

Next, a light deflector according to a fourth embodiment is described. In the light deflector according to the fourth embodiment as illustrated in FIG. 6, a projection 133 is provided with an end-corner fillet 143 at the other end of the projection 133 as well as the fillet 142 at the end proximate to the torsion bar 120 along the first axis. With the fillet 143 provided at the corner of the projection 133, the weight of the drive beam 130 is reduced, which achieves an increase in the resonance frequency while preventing a failure of the light deflector due to the bending of the drive beam 130. In the present disclosure, the fillet 143 at the corner of the projection 133 is referred to as a third fillet.

The characteristic features other that those described above are the same as those in the first embodiment.

Figure 7:
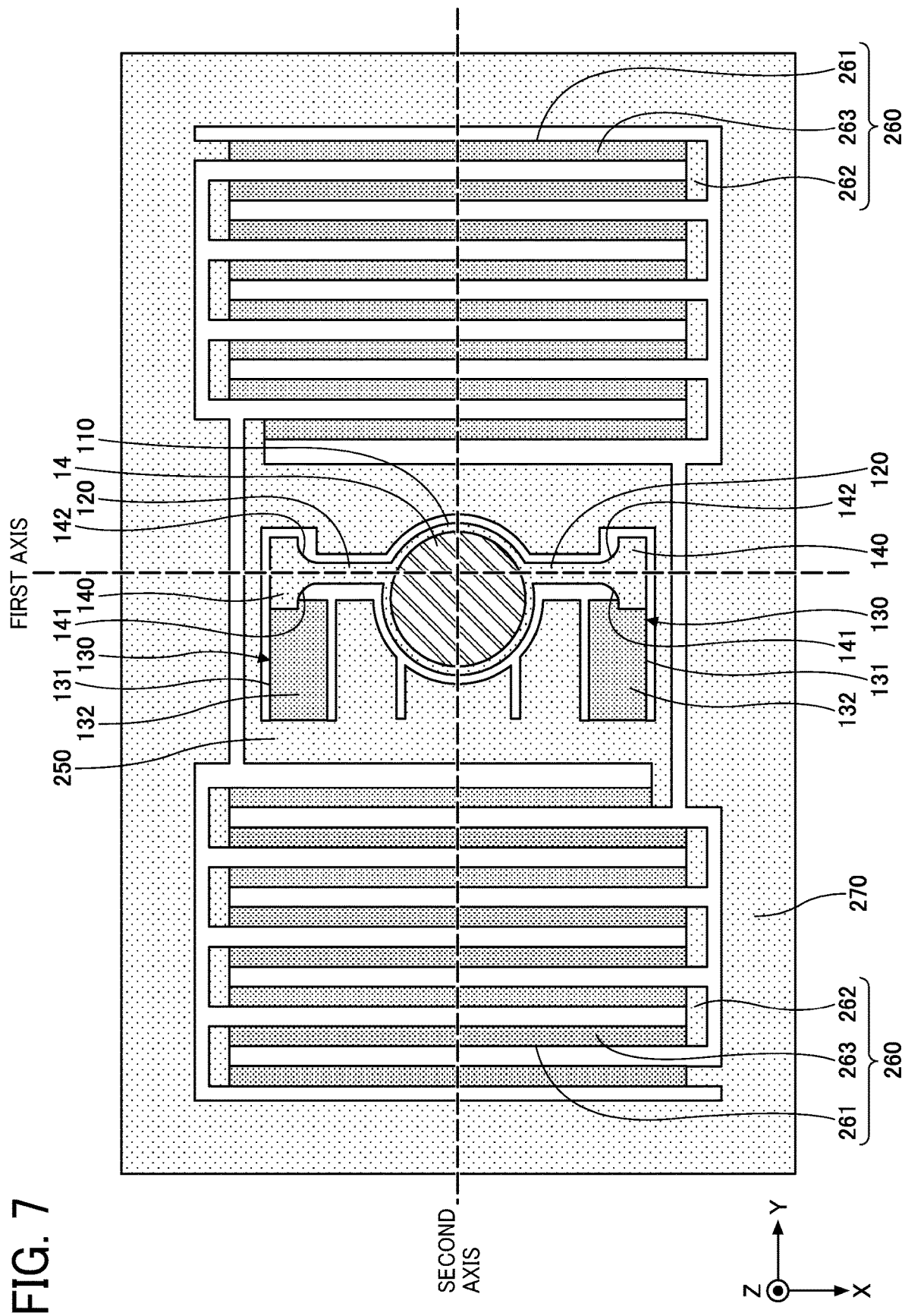
FIG. 7 is a top view of a light deflector according to a fifth embodiment of the present disclosure.

Next, a light deflector according to a fifth embodiment is described. The light deflector according to the fifth embodiment is rotatable around the first axis and a second axis orthogonal to the first axis. Specifically, the light deflector in FIG. 7 is provided with the mirror unit 110, the torsion bars 120, the drive beams 130, the fixed-end fillet 141, and the free-end fillet 142, which are configured according to the first embodiment, within a sub-scanning movable frame 250. The drive beam 130 is supported by the movable frame 250, and the mirror unit 110 is rotatable about the first axis. In the light deflector according to the present embodiment, the drive beam 130 is a main-scanning drive beam.

The movable frame 250 is provided with a movable-frame support 260 at each side thereof, and each movable-frame support 260 has a meandering structure The movable-frame support 260 includes a plurality of beams 261 whose longitudinal direction is the X-axis direction, beam connecting parts 262 each connecting adjacent beams 261, and piezoelectric member on the respective beams 261. One end of each of the movable-frame supports 260 is coupled to the movable frame 250, and the other end of each of the movable-frame supports 260 is coupled to the stationary frame 270.

In the light deflector according to the present embodiment, the movable frame 250 as a whole including the mirror unit 110 is rotatable about the second axis in response to a voltage applied to the piezoelectric members 263 on the respective beams 261.

In the above description, the case in which the first embodiment is applied is described. In some embodiments, any of the second embodiment to the fifth embodiment is applicable.

The movable device according to the embodiments described above is applicable in an optical scanning system, an image projection device, an optical writing device, and an object recognition device.

With initially reference to FIGS. 8 to 11, an optical scanning system 10 to which a driver 11 according to an embodiment of the present disclosure is applied is described below in detail.

Figure 8:
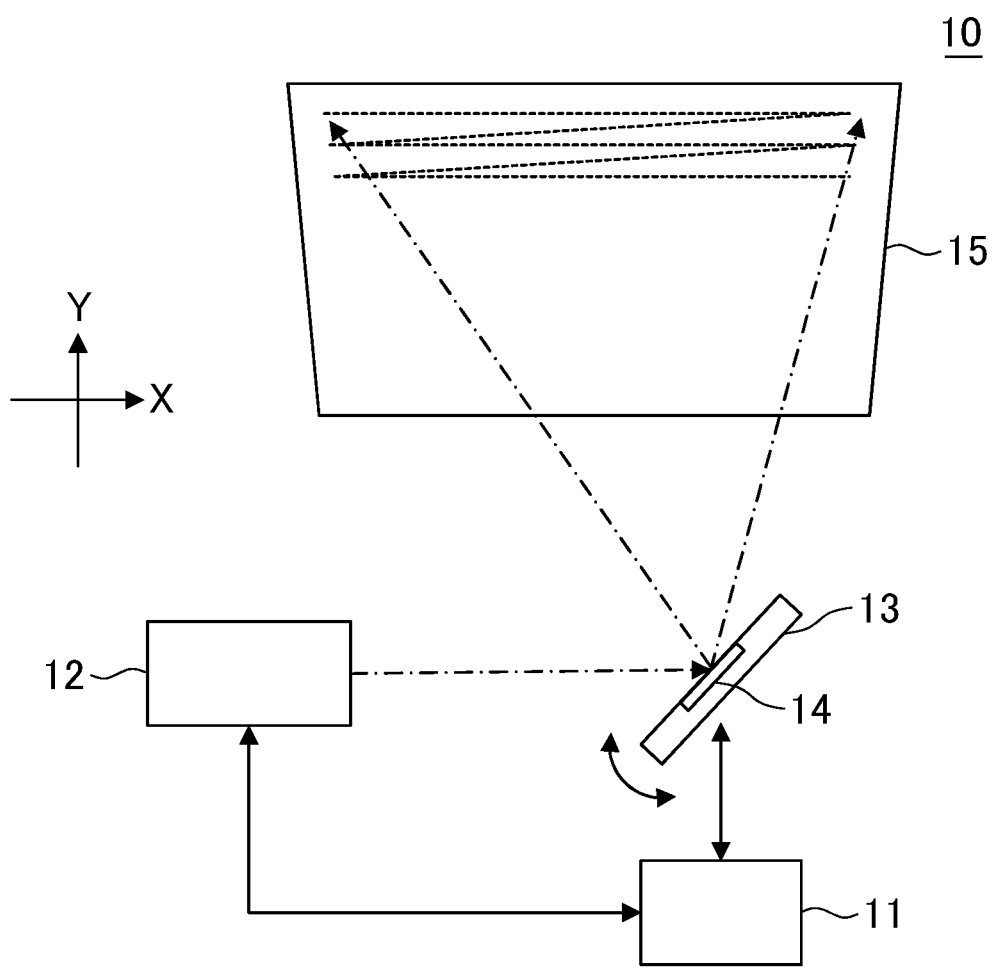
FIG. 8 is a schematic view of an example of an optical scanning system.

FIG. 8 is an illustration of an optical scanning system according to an embodiment of the present disclosure.

As illustrated in FIG. 8, the optical scanning system 10 deflects light emitted from a light-source device 12 in accordance with the control of the driver 11, using a reflecting surface 14 included in a light deflector 13, so as to optically scan a surface 15 to be scanned (target surface).

The optical scanning system 10 includes the driver 11, the light-source device 12, and the light deflector 13 including the reflecting surface 14. The optical scanning system 10 is an example of a deflecting device according to an embodiment of the present disclosure.

The driver 11 is, for example, an electronic circuit unit including, for example, a central processing unit (CPU) and a field-programmable gate array (FPGA). The light deflector 13 is, for example, a micro electro mechanical systems (MEMS) device that includes a reflecting surface 14 and that can move the reflecting surface 14. The light-source device 12 is, for example, a laser device that emits a laser beam. The target surface 15 is, for example, a screen.

The driver 11 generates a control instruction of the light-source device 12 and the light deflector 13 based on optical scanning information obtained from an external device, and outputs a drive signal to the light-source device 12 and the light deflector 13 in accordance with the control instruction.

The light-source device 12 emits light based on the received drive signal. The light deflector 13 moves the reflecting surface 14 in at least one of a uniaxial direction and a biaxial direction, based on the received drive signal.

With this configuration, for example, the reflecting surface 14 of the light deflector 13 is biaxially moved in a reciprocating manner within a predetermined range, and the light emitted from the light-source device 12 to be incident on the reflecting surface 14 is deflected to perform optical scanning, under the control of the driver 11, which is based on image data that is an example of the optical-scanning information. Accordingly, an image can be projected onto the target surface 15 as desired.

The light deflector and the driver are described in detail in accordance with an embodiment of the present disclosure.

Figure 9:
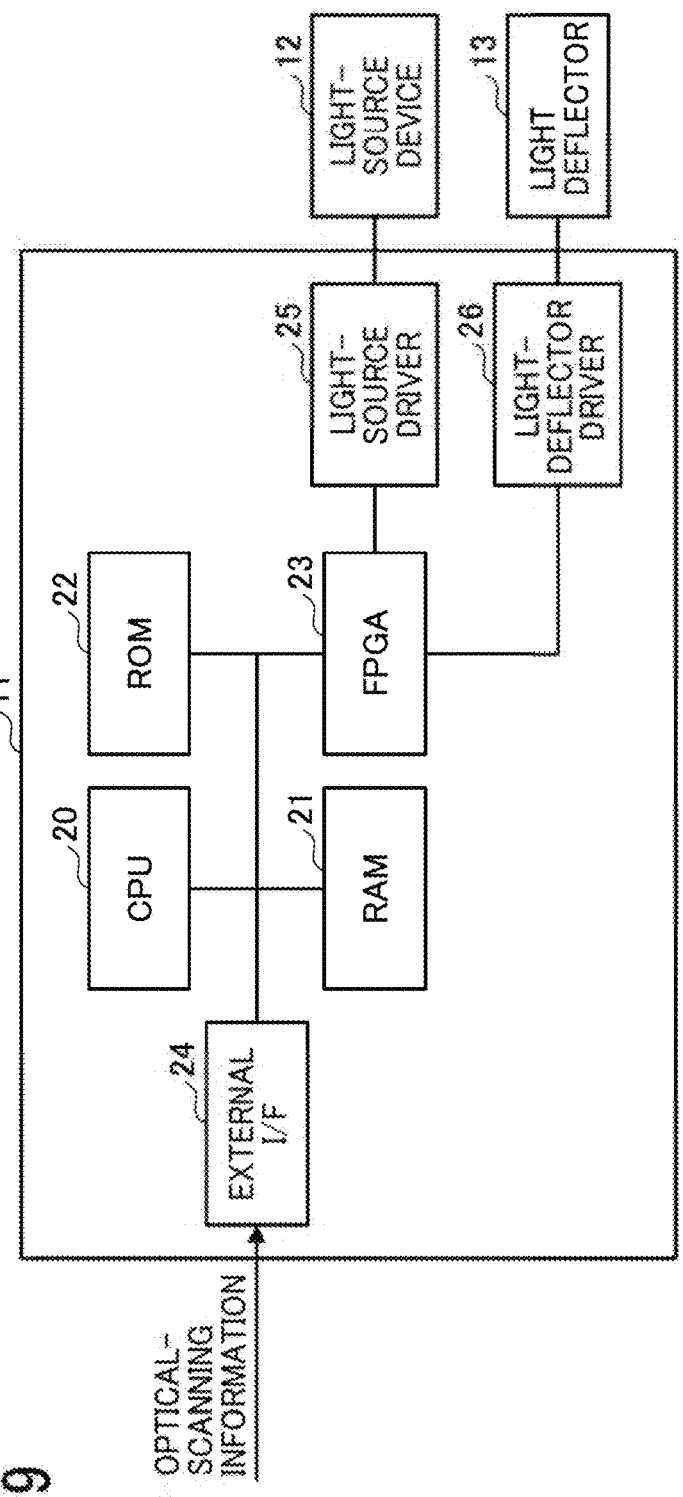
FIG. 9 is a hardware block diagram of the optical scanning system according to an embodiment of the present disclosure.

Referring now to FIG. 9, a hardware configuration of the optical scanning system 10 is described below.

FIG. 9 is a hardware block diagram of an example of the optical scanning system.

As illustrated in FIG. 9, the optical scanning system 10 includes the driver 11, the light-source device 12, and the light deflector 13, which are electrically connected to each other.

The driver 11 includes a CPU 20, a random access memory (RAM) 21, a read only memory (ROM) 22, a FPGA 23, an external interface (I/F) 24, a light-source driver 25, and a light-deflector driver 26.

The CPU 20 is an arithmetic device that loads into the RAM 21 a program or data from a storage device such as the ROM 22 and executes processing to provide the controls or functions of the entirety of the driver 11. The RAM 21 is a volatile storage device that temporarily holds a program and data.

The ROM 22 is a non-volatile storage device that stores a program or data even after the power is turned off, and stores a program or data for processing that is executed by the CPU 20 to control each function of the optical scanning system 10.

The FPGA 23 is a circuit that outputs control signals to the light-source driver 25 and the light-deflector driver 126, respectively, according to a process performed by the CPU 20.

For example, the external I/F 24 is an interface with respect to an external device or a network. The external device may be, for example, a host device such as a personal computer (PC); or a storage device, such as a universal serial bus (USB) memory, a secure digital (SD) card, a compact disk (CD), a digital versatile disk (DVD), a hard disk drive (HDD), or a solid state drive (SSD). For example, the network may be a controller area network (CAN) of a vehicle, a local area network (LAN), or the Internet. The external I/F 24 can have any configuration that can achieve connection to an external device or communication with an external device. The external I/F 24 may be provided for each external device.

The light-source driver 25 is an electric circuit that outputs a drive signal such as a drive voltage to the light-source device 12 in accordance with the received control signal.

The light-deflector driver 26 is an electric circuit that outputs a driving signal such as a driving voltage to the light deflector 13 in accordance with the control signal input from the FPGA 23.

The CPU 20 of the driver 11 acquires optical-scanning information from an external device or a network through the external I/F 24. Note that any configuration may be used as long as the CPU 20 can acquire the optical-scanning information, and the optical-scanning information may be stored in the ROM 22 or in the FPGA 23 in the driver 11. Alternatively, a storage device such as an SSD may be additionally provided in the driver 11 and the optical-scanning information may be stored in the storage device.

In this case, the optical-scanning information is information indicating the way of optical scanning to be performed on the target surface 15. The optical-scanning information is, for example, image data when an image is displayed by optical scanning. For another example, the optical-scanning information is writing data indicating the order and portion of writing when optical writing is performed by optical scanning. Furthermore, for example, the e optical scanning information is irradiation data indicating the tuning and range of irradiation of light for object recognition in a case where an object is to be recognized by optical scanning.

The driver 11 according to the present embodiment provide the functional configuration described below by using instructions from the CPU 20 and the hardware configuration illustrated in FIG. 9.

Figure 10:
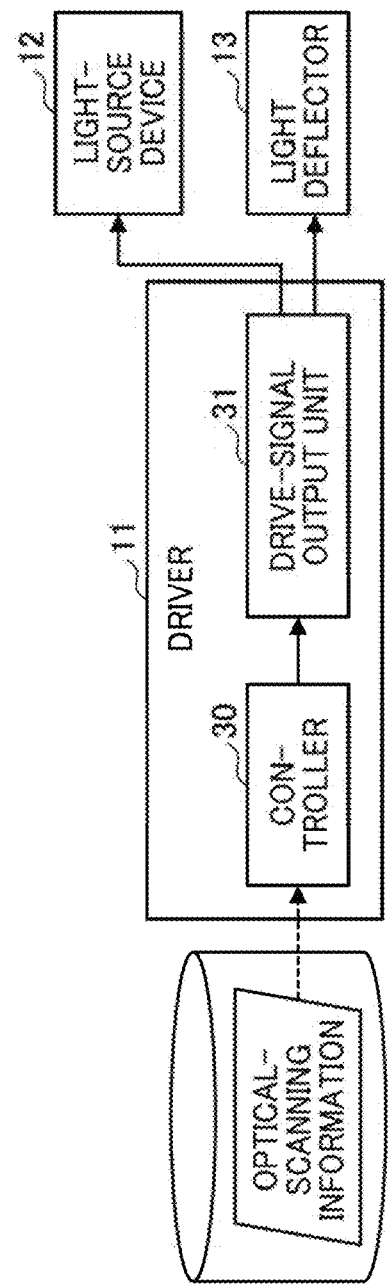
FIG. 10 is a functional block diagram of a driver according to an embodiment of the present disclosure.

The following describes a functional configuration of the driver 11 of the optical scanning system 10, with reference to FIG. 10. FIG. 10 is a functional block diagram of an example of the driver 11 of the optical scanning system 10, according to an embodiment of the present disclosure.

As illustrated in FIG. 10, the driver 11 has the functions of a controller 30 and a driving-signal output unit 31.

The controller 30 is implemented by, for example, the CPU 20 and the FPGA 23. The controller 30 acquires optical-scanning information from an external device, converts the optical-scanning information into a control signal, and outputs the control signal to the drive-signal output unit 31. The controller 30, for example, acquires image data as the optical-scanning information from, for example, an external device, generates a control signal based on the image data through predetermined processing, and outputs the control signal to the drive-signal output unit 31.

The drive-signal output unit 31 is implemented by, for example, the light-source driver 25 or the light-deflector driver 26. The drive-signal output unit 31 outputs a drive signal to the light-source device 12 or the light deflector 13 in accordance with the received control signal. The drive-signal output unit 31 may be provided for each destination to which a driving signal is output.

The drive signal is a signal for controlling the drive of the light-source device 12 or the light deflector 13. For example, the drive signal of the light-source device 12 is a drive voltage used to control the irradiation timing and irradiation intensity of the light source. Further, the drive signal to be output to the light deflector 13 is, for example, a drive voltage used to control the timing and range of motion where the reflecting surface 14 of the light deflector 13 is moved. Alternatively, the driver 11 may obtain, from an external device such as the light-source device 12 or a light receiver, the timing of light emission or timing of light reception of the light emitted from the light source, and may synchronize the obtained timing of light emission or timing of light receptor with the operation of the light deflector 13.

Figure 11:
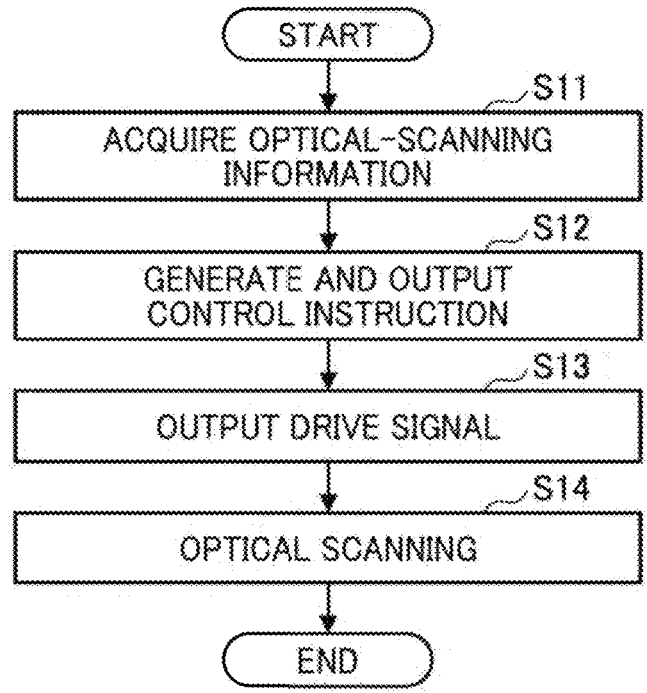
FIG. 11 is a flow chart of the processing involved in the optical scanning system, according to an embodiment of the present disclosure.

Next, a process of optically scanning the target surface 15 by using the optical scanning system 10 is described referring to FIG. 11. FIG. 11 is a flowchart of an example of processing performed by the optical scanning system 10.

In step S11, the controller 30 acquires optical-scanning information from, for example, an external device.

In step S12, the controller 30 generates control signals from the acquired optical-scanning information, and outputs the control signals to the drive-signal output unit 31.

In step S13, the drive-signal output unit 31 outputs drive signals to the light-source device 12 and the light deflector 13, respectively, in accordance with the received control signals.

In step S14, the light-source device 12 emits light based on the received drive signal. In addition, the light deflector 13 moves the reflecting surface 14 based on the received drive signal. Driving the light-source device 12 and the light deflector 13 causes light to be deflected in a given direction, and optical scanning is performed.

In the above-described optical scanning system 10, a single controller 11 has a device and a function for controlling the light-source device 12 and the light deflector 13. However, a driver for the light-source device and a driver for the movable device may be separate elements.

In the above-described optical scanning system 10, a single driver 11 has the function of the controller 30 and the function of the drive-signal output unit 31 for the light-source device 12 and the light deflector 13. These functions may be implemented by separate elements. For example, a drive-signal output device including a drive-signal output unit 31 may be provided in addition to the driver 11 including the controller 30. In the above-described optical scanning system 10, the light deflector 13 having the reflecting surface 14 and the driver 11 may constitute a light deflection system for performing optical deflection.

Incorporating the light deflector according to the embodiments of the present disclosure into an optical scanning system enables the movable part to optically write data at a higher angle of view and a higher resolution.

Next, an image projection device to which the driver 11 according to an embodiment of the present disclosure is applied is described in detail with reference to FIGS. 12 and 13.

Figure 12:
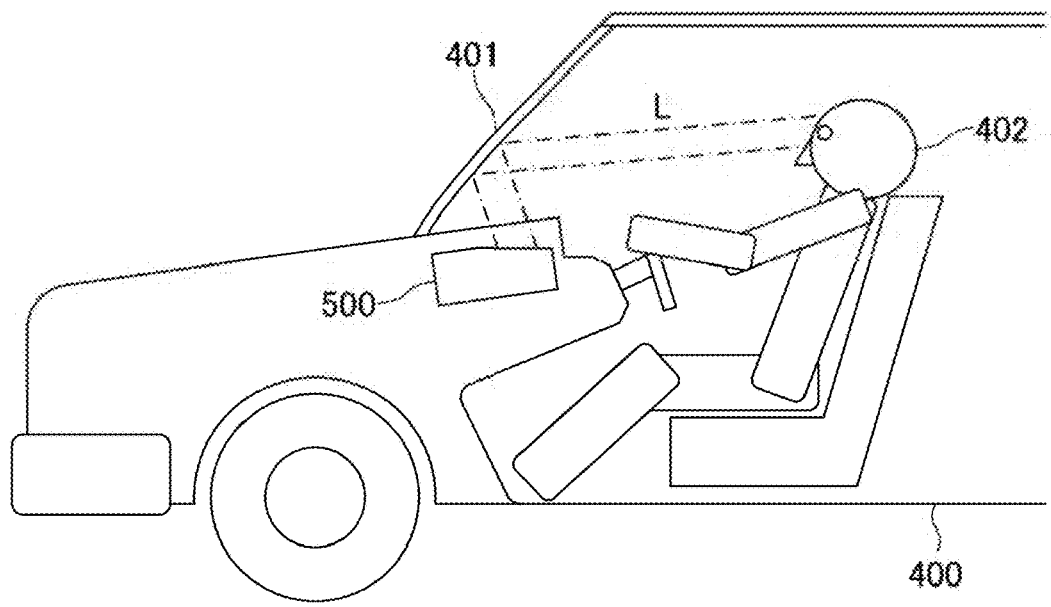
FIG. 12 is a schematic view of an example of a vehicle equipped with a head-up display device (HUD)

FIG. 12 is a schematic view of a vehicle 400 equipped with a HUD 500 as an example of an image projection device according to an embodiment.

Figure 13:
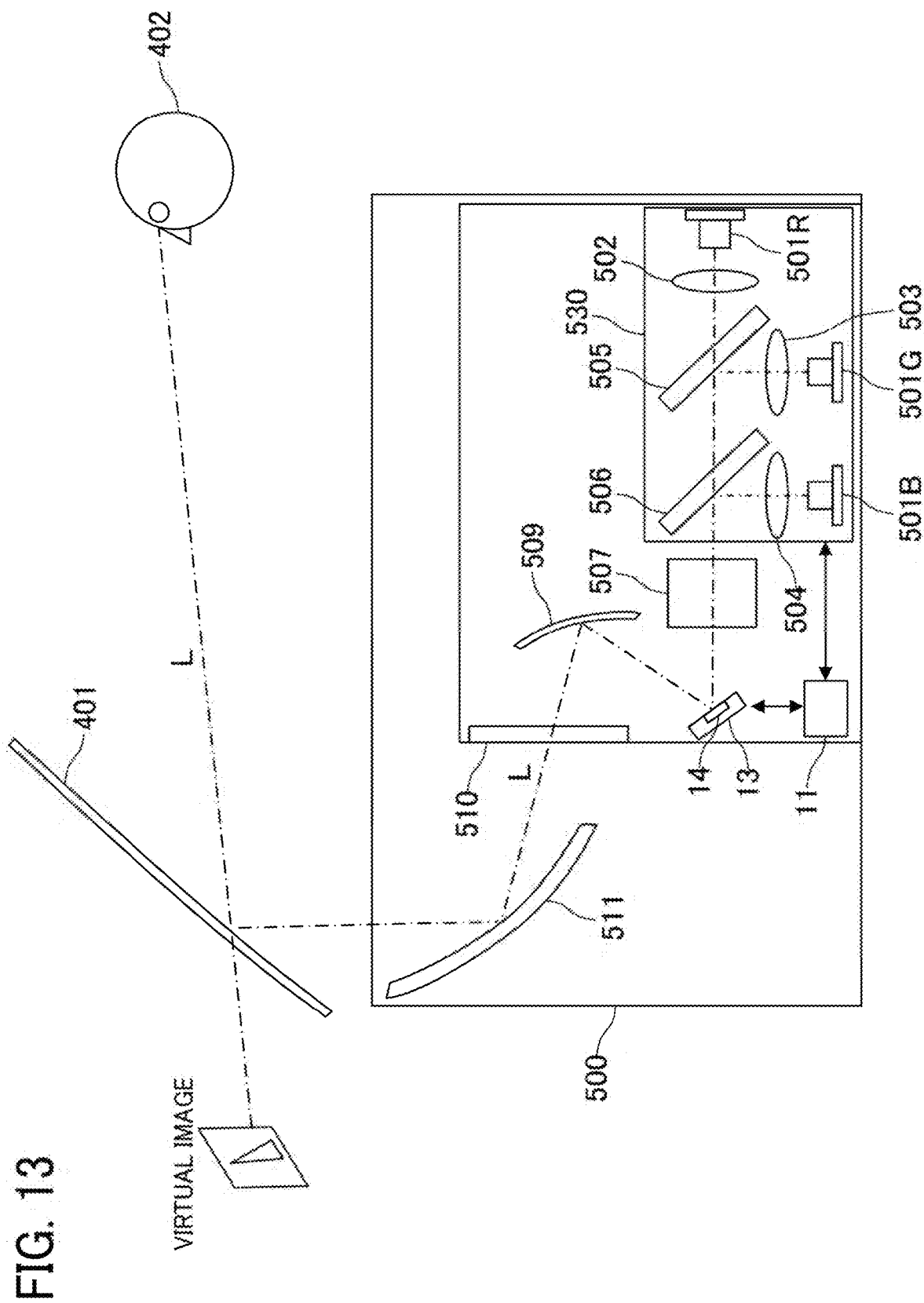
FIG. 13 is a schematic view of a HUD according to an embodiment of the present disclosure.

FIG. 13 is a schematic view of the HUD 500 according to an embodiment of the present disclosure.

The image projection device projects an image by optical scanning, and is, for example, a HUD.

As illustrated in FIG. 12, for example, the HUD 500 is disposed, for example, near a windshield 401 of the vehicle 400. Projection light L that is emitted from the HUD 500 is reflected by the windshield 401 and directed to a viewer (a driver 402) as a user.

Accordingly, the driver 402 can visually recognize an image or the like projected by the HUD 500, as a virtual image. Alternatively, a combiner may be disposed on the inner wall surface of the windshield 401 so that the user can visually recognize a virtual image formed by the projection light that is reflected by the combiner.

As illustrated in FIG. 13, the HUD 500 emits laser beams through red, green, and blue laser beam sources 501R, 501G, and 501B, respectively. The emitted laser beams pass through an incident optical system, and then are deflected by the light deflector 13 including the reflecting surface 14. The incident optical system includes collimator lenses 502, 503, and 504 respectively provided for the laser-beam sources 501R, 501G, and 501B, two dichroic mirrors 505 and 506, and a light-intensity adjuster 507.

The deflected laser beams pass through a projection optical system, and are projected onto a screen. The projection optical system includes a free-form surface mirror 509, an intermediate screen 510, and a projection mirror 511.

In the HUD 500, the laser-beam soirees 501R, 501G, 501B, the collimator lenses 502, 503, 504, and the dichroic mirrors 505, 506 are combined as a single unit that is an optical housing serving as a light source unit 530.

The HUD 500 projects an intermediate image displayed on the intermediate screen 510 onto the windshield 401 of the vehicle 400 to allow the driver 402 to visually recognize the intermediate image as a virtual image.

The laser beams of RGB colors emitted from the laser-beam sources 501R, 501G, and 501B are approximately collimated by the collimator lens 502, 503, and 504, and are combined by the two dichroic mirrors 505 and 506. The light intensity of the combined laser beams is adjusted by the light-intensity adjuster 507, and then two-dimensional scanning is performed by the light deflector 13 provided with the reflecting surface 14. The projection light L used for two-dimensional scanning by the light deflector 13 is reflected by the free-form surface mirror 509 so as to correct the distortion, and then is collected and focused onto the intermediate screen 510 to display an intermediate image on the intermediate screen 510. The intermediate screen 510 includes a microlens array in which a plurality of microlenses are two-dimensionally arranged, and enlarges the projection light L incident on the intermediate screen 510 in units of microlens.

The light deflector 13 moves the reflecting surface 14 biaxially in a reciprocating manner to perform two-dimensional scanning with the projection light L incident on the reflecting surface 14. The driving of the light deflector 13 is controlled in synchronization with the timing of light emission of the laser beam sources 501R, 501G, and 501B.

In the above description, the HUD 500 is described as an example of the image projection device. However, no limitation is indicated thereby, and the image projection device may be any apparatus that performs optical scanning, using light deflector 13 provided with the reflecting surface 14 to project an image.

For example, the present disclosure is also applicable to a projector that is placed on a desk or the like and projects an image on a display screen, a bead-mounted display device that is incorporated in a wearable member on the head of the observer, for example, and that projects an image on a reflective-and-transmissive screen of the wearable member or on an eyeball as a screen, and the like.

The image projection device may be incorporated in, not only the vehicle or the wearable member, but also, for example, a mobile object such as an aircraft, a ship, or a mobile robot; or an immobile object such as an operation robot that operates a driving target such as a manipulator without moving from the installed location.

Incorporating the light deflector according to the embodiments of the present disclosure into an image projection device enables the movable part to optically write data at a higher angle of view and a higher resolution.

Next, an optical wilting device to which the driver 11 according to an embodiment of the present disclosure is applied is described in detail with reference to FIGS. 14 and 15.

Figure 14:
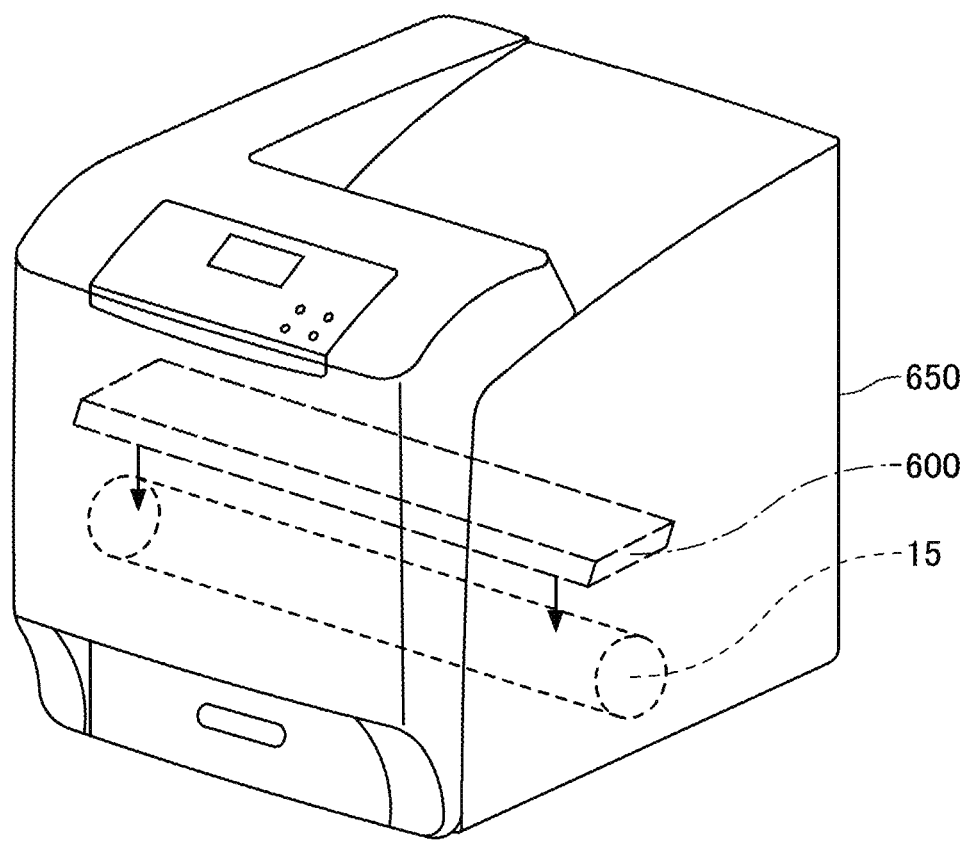
FIG. 14 is a schematic view of an example of an image forming apparatus equipped with an optical writing device.

FIG. 14 is an illustration of an example of an image forming apparatus equipped with an optical writing device 600.

Figure 15:
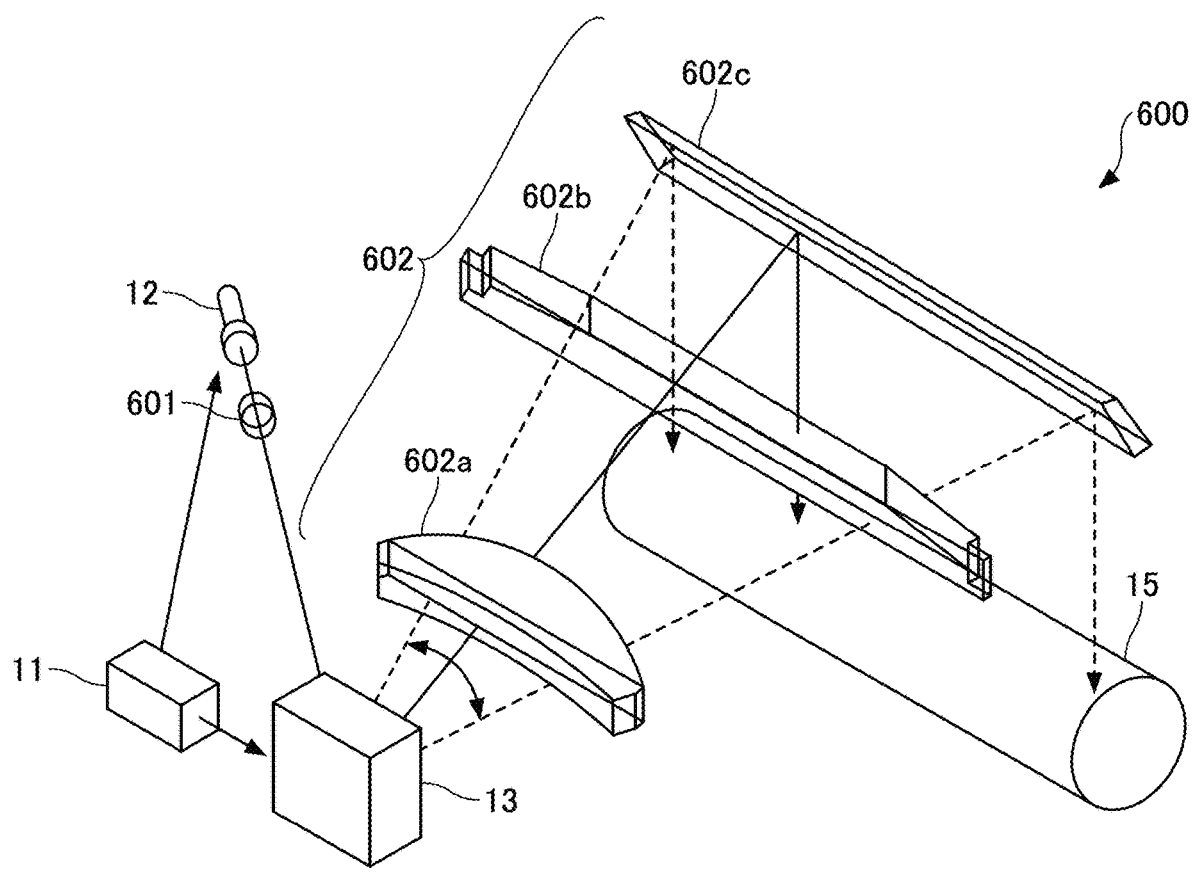
FIG. 15 is a schematic view of an example of the optical writing device.

FIG. 15 is a schematic view of an example of the optical writing device 600.

As illustrated in FIG. 14, the optical writing device 600 is used as a component of an image forming apparatus typified by a laser printer 650, for example, having printer functions using laser beams. In the image forming apparatus, the optical writing device 600 performs optical scanning on a photoconductor drum, which is the target surface 15, by using one or more laser beams, thereby performing optical writing on the photoconductor drum.

As illustrated in FIG. 15, in the optical writing device 600, the laser beam from the light-source device 12 such as a laser element passes through an image forming optical system 601 such as a collimator lens and is then deflected uniaxially or biaxially by the light deflector 13 including the reflecting surface 14.

The laser beam deflected by the light deflector 13 passes through a scanning optical system 602 constituted by a first lens 602a, a second lens 602b, and a reflecting mirror unit 602c, and is emitted onto the target surface 15 (e.g., a photoconductor drum or photosensitive paper), thus performing optical writing. The scanning optical system 602 forms a laser beam in the form of a spot on the target surface 15.

The light deflector 13 that includes the light-source device 12 and the reflecting surface 14 are driven in accordance with the control of the driver 11.

As described above, the optical writing device 600 can be used as a component of the image forming apparatus having a printer function using laser beams.

Moreover, by employing another scanning optical system to perform scanning in a biaxial manner in addition to the uniaxial manner, the optical writing device 600 can also be used as a component of an image forming apparatus such as a laser label apparatus that deflects laser beams to perform optical scanning on thermal media and print letters by heating.

The light deflector 13 including the reflecting surface 14 to be applied to the optical writing device is advantageous in saving power of the optical writing device because power consumption for driving the light deflector 13 is less than that for driving a rotational polygon mirror or the like.

The light deflector 13 makes a smaller wind noise when the mirror substrate oscillates than rotational polygon mirror, and thus is advantageous in achieving low noise of the optical writing device. The optical writing device requires much smaller installation space than a rotational polygon mirror, and the amount of heat generated by the light deflector 13 is small. For this reason, downsizing is easily achieved, and thus the optical writing device is advantageous in downsizing the image forming apparatus.

Incorporating the light deflector according to the embodiments of the present disclosure into an optical writing device enables the movable part to optically write data at a higher angle of view and a higher resolution.

Next, an object recognition device to which the driver according to an embodiment of the present disclosure is applied is described in detail with reference to FIGS. 16 and 17.

Figure 16:
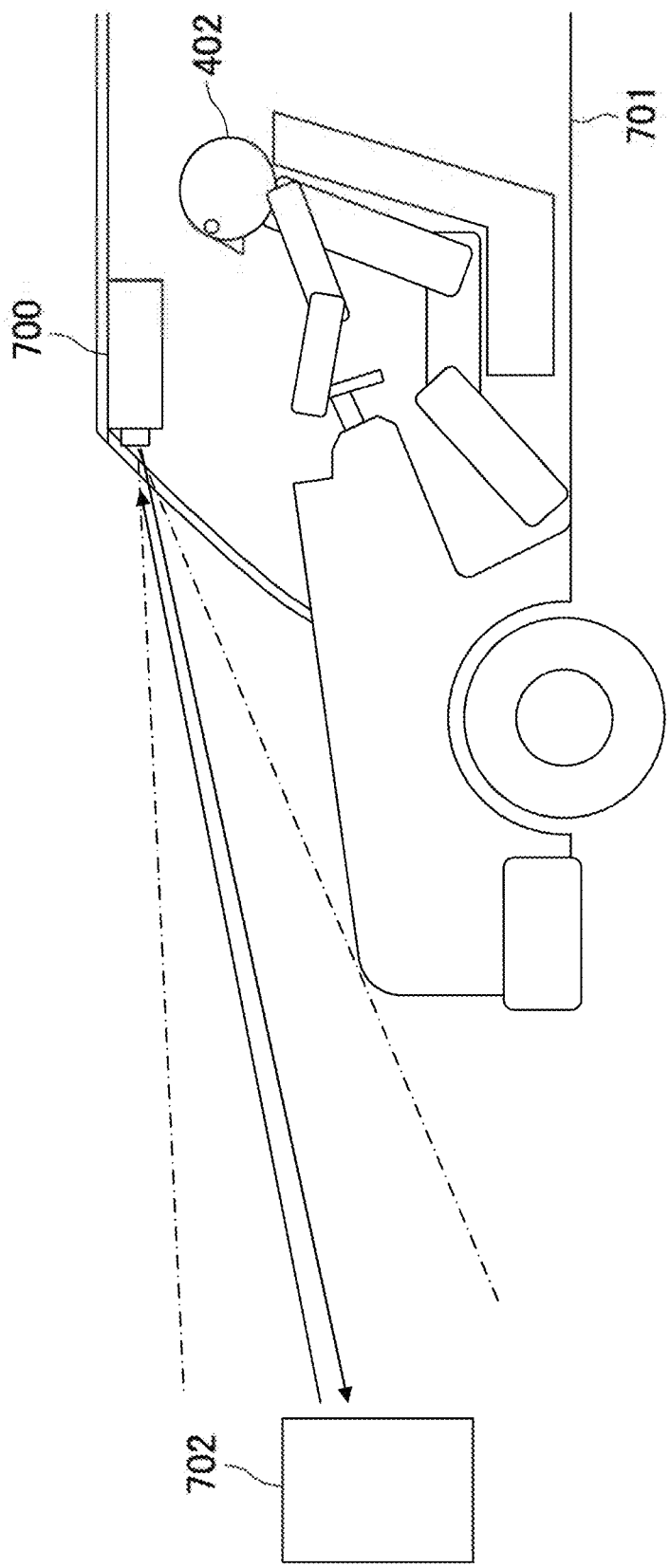
FIG. 16 is a schematic view of a motor vehicle mounted with a light detection and ranging (LiDAR) device.

FIG. 16 is a schematic diagram of a vehicle provided with a LiDAR device dial serves as an object recognition device as a distance measurement device, according to the present embodiment.

Figure 17:
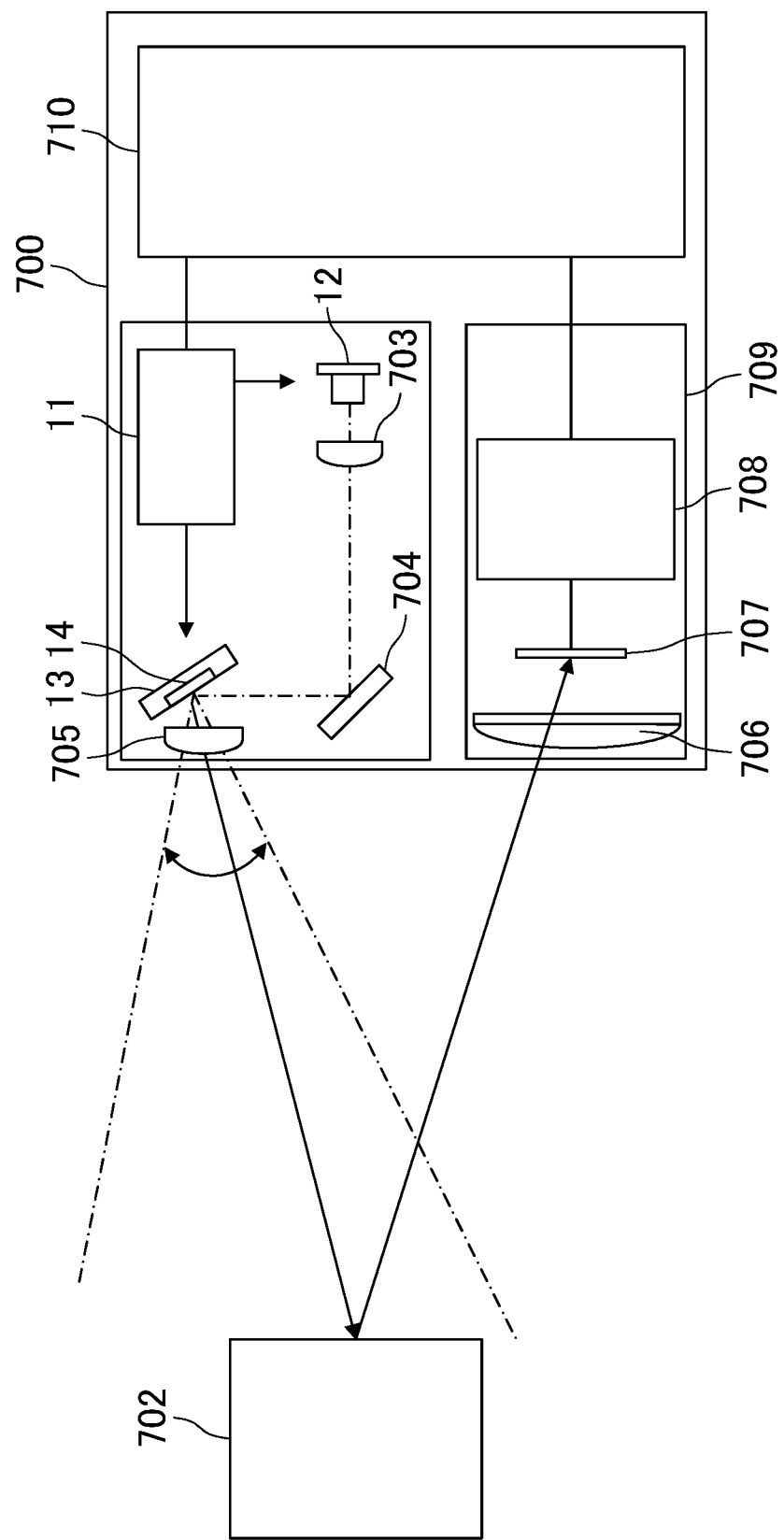
FIG. 17 is a schematic view of the LiDAR device according to an embodiment of the present disclosure.

FIG. 17 is a schematic view of an example of the LiDAR device.

The object recognition device is an apparatus that recognizes an object in a target direction and is, for example, a LiDAR device.

As illustrated in FIG. 16, for example, a LiDAR device 700 is mounted on a vehicle 701 to perform optical scanning in a target direction and receive the light reflected from an object 702 that exists in the target direction. Accordingly, the object 702 can be recognized by the LiDAR device 700.

As illustrated in FIG. 17, the laser beams emitted from a light-source device 12 pass through an incident optical system, and then are caused to perform stunning uniaxially or biaxially using the light deflector 13 including the reflecting surface 14. The incidence optical system includes a collimator lens 703 that serves as an optical system that collimates divergent beams into approximately parallel beams, and a planar mirror 704.

The parallel beams are emitted to the object 702 ahead of the device, as passing through, for example, a projection lens 705 that serves as a projection optical system. The driving of the light-source device 12 and the light deflector 13 is controlled by the driver 11. The light reflected by the object 702 is detected by a photosensor 709.

More specifically, the reflected light passes through, for example, a condenser lens 706 that serves as an incident-light receiving optical system, and is received by an image sensor 707. Then, the image sensor 707 outputs a detected signal to a signal processing circuit 708. The signal processing circuit 708 performs predetermined processing on the received detected signal, such as binarization or noise processing, and outputs the result to a distance measuring circuit 710.

The distance measuring circuit 710 determines whether the object 702 is present based on the time difference between the timing at which the light-source device 12 emits laser beams and the timing at which the photosensor 709 receives the laser beams or the phase difference per pixel of the image sensor 707 that have received the laser beams. Moreover, the distance measuring circuit 710 calculates distance information indicating the distance from the object 702.

The light deflector 13 including the reflecting surface 14 is less likely broken and is compact compared with a polygon mirror, and thus, a highly durable and compact LiDAR device can be provided.

Such a LiDAR device is attached to, for example, a vehicle, an aircraft, a ship, a robot, or the like, and can perform optical scanning within a predetermined range to determine whether an obstacle is present or to recognize the distance to the obstacle. In the present embodiment, the LiDAR device 700 is described as an example of the object recognition device. However, no limitation is intended thereby the object recognition device may be any apparatus that performs optical scanning by controlling the light deflector 13 provided with the reflecting surface 14, using the driver 11, and that receives the receives the reflected laser beam using a photosensor to recognize the object 702.

For example, the present disclosure is also applicable to a biometric authentication apparatus, a security sensor, or a component of a three-dimensional scanner, for example. The biometric authentication apparatus performs optical scanning on a hand or face to obtain distance information, calculates object information such as the shape of the object based on the distance information, and refers to records to recognize the object. The security sensor performs optical scanning in a target range to recognize an incoming object.

The three-dimensional scanner performs optical scanning to obtain distance information, calculates object information such as the shape of the object based on the distance information to recognize the object, and outputs the object information in the form of three-dimensional data.

Incorporating the light deflector according to the embodiments of the present disclosure into an object recognition device enables the movable part to optically write data at a higher angle of view and a higher resolution.

Next, the packaging of the light deflector 13 that is controlled by the driver 18 according to an embodiment of the present disclosure is described with reference to FIG. 11.

Figure 18:
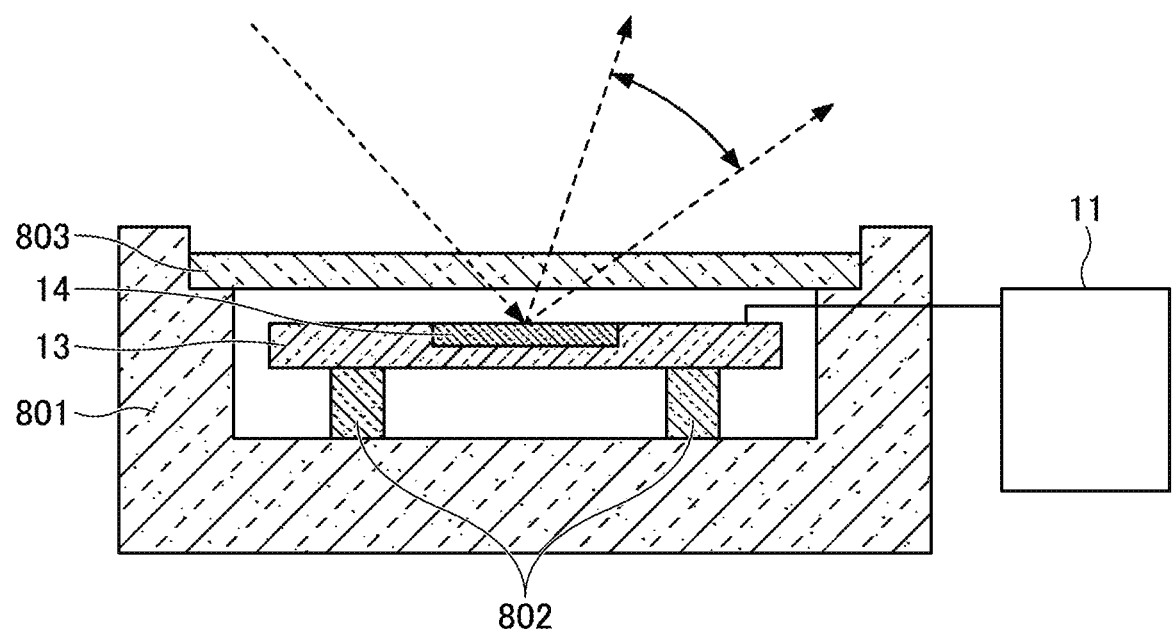
FIG. 18 is a schematic diagram of a packaged light deflector according to a first embodiment of the present disclosure.

FIG. 18 is a schematic diagram of the light deflector 13 packaged according to an embodiment of the present disclosure.

As illustrated in FIG. 18, the light deflector 13 is mounted on a mounting member 802 inside a package member 801. The package member 801 is partly covered with and sealed by a transmissive member 803 so that the light deflector 13 is packaged.

The package contains inert gas such as nitrogen and is sealed. This configuration can prevent the deterioration of the light deflector 13 due to oxidation, and increase the durability against changes in environment such as temperature.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A light deflector comprising:
   a mirror having a reflecting surface configured to reflect light;
   a pair of supports, one end of each of the pair of supports coupled to the mirror to support the mirror;
   a pair of drive beams each coupled to the other end of a corresponding support of the pair of supports, the pair of drive beams being configured to deform the pair of supports to rotate the mirror around a first axis;
   a frame supporting the pair of drive beams in a cantilevered state; and
   connecting parts connecting the pair of drive beams to the pair of supports, respectively,
   each of the connecting parts having:
   a first area that is one of areas divided by the first axis on a plane parallel to the reflecting surface when the pair of drive beams are not operating, and the pair of drive beams are only located in the first area; and
   a second area at an opposite side of the first area relative to the first axis,
   the second area including a projection projecting in a direction opposite to a direction toward a portion at which a corresponding drive beam is supported by the frame, and
   the projection including a first fillet of a fillet shape at an end proximate to a corresponding support of the pair of supports, the projection projects in a direction away from the first axis more than the pair of supports, and the projection is a free end that is free from undesired constraints when the mirror rotates.

2. The light deflector according to claim 1,
wherein the first area includes a second fillet of a fillet shape at a portion proximate to the corresponding support of the pair of supports.

3. The light deflector according to claim 2,
wherein the first fillet has a different curvature than the second fillet.

4. The light deflector according to claim 1,
wherein the first fillet has an elliptic shape.

5. The light deflector according to claim 1,
wherein the first fillet has an arc shape with a central angle of 90 degrees or less.

6. The light deflector according to claim 1,
wherein the projection includes a third fillet at the other end of the projection along the first axis.

7. The light deflector according to claim 1, wherein
the frame is a movable frame, and
the light deflector further comprises:
 a pair of movable supports, one end of each of the pair of movable supports coupled to the movable frame to support the movable frame such that the movable frame is rotatable around a second axis orthogonal to the first axis; and
 a stationary frame coupled to the other end of each of the pair of movable supports.

8. A deflecting device comprising;
the light deflector according to claim 1; and
a light source.

9. A distance measurement device comprising the light deflector according to claim 1.

10. A vehicle comprising the distance measurement device according to claim 9.

11. An image projection device comprising the light deflector according to claim 1.

12. A vehicle comprising the image projection device according to claim 11.

\* \* \* \* \*